United States Patent [19]

Ogura

[11] Patent Number: 5,006,887
[45] Date of Patent: Apr. 9, 1991

[54] IMAGE FORMING APPARATUS

[75] Inventor: Mitsuru Ogura, Nara, Japan

[73] Assignee: Sharp Kabushiki Kaisha, Osaka, Japan

[21] Appl. No.: 479,866

[22] Filed: Feb. 14, 1990

[30] Foreign Application Priority Data

Mar. 7, 1989 [JP] Japan .................. 1-25635[U]
Mar. 7, 1989 [JP] Japan .................. 1-25636[U]
Mar. 7, 1989 [JP] Japan .................. 1-54355

[51] Int. Cl.$^5$ ............................. G03B 27/58
[52] U.S. Cl. ..................... 355/72; 355/309; 355/213; 242/58
[58] Field of Search ............ 355/213, 212, 309, 72; 242/58, 74

[56] References Cited

U.S. PATENT DOCUMENTS

| | | |
|---|---|---|
| 3,737,230 | 6/1973 | Van Meijel et al. |
| 3,984,241 | 10/1976 | Schrempp et al. |
| 4,057,344 | 11/1977 | Wick et al. |
| 4,088,403 | 5/1978 | Kingsley |
| 4,231,652 | 11/1980 | Moser et al. |
| 4,912,510 | 3/1990 | Ogura et al. ............ 355/212 |
| 4,914,479 | 4/1990 | Ogura et al. ............ 355/213 |
| 4,918,482 | 4/1990 | Oguru ...................... 355/72 X |
| 4,942,422 | 7/1990 | Mashiko et al. ........ 355/72 X |

Primary Examiner—R. L. Moses

[57] ABSTRACT

An image forming apparatus comprises a carriage freely attached and removed containing a photosensitive sheet, copy paper whereon a latent image that was formed on the photosensitive sheet is transferred by pressure developing rollers, a winding shaft whereon the used photosensitive sheet is wound, a loading guide plate, capable of pivoting freely, incorporated in the carriage and installed on the opposite side of a jam processing operation section on the transportation path of the photosensitive sheet, a tension spring mounted on the loading guide plate that maintains the loading guide plate in a loading position guiding the photosensitive sheet toward the winding shaft, and in a retreat position creating a transportation path for the copy paper between the loading guide plate and a copy paper guide plate, a horizontal shaft mounted over the surface of the loading guide plate that drives the loading guide plate to a retreat position in accordance with the tension of the photosensitive sheet when the photosensitive sheet is wound on the winding shaft, a winding sensing switch that operates in response to the stretching action of the photosensitive sheet, and a contact member mounted on a member of the main body of the apparatus that drives the loading guide plate in the loading position when the loading guide plate is drawn out together with the carriage.

14 Claims, 6 Drawing Sheets

IMAGE FORMING APPARATUS

FIELD OF THE INVENTION

The present invention relates to an image forming apparatus that copies a desired image on a copy paper by transferring a latent image, formed through exposure on a photosensitive sheet, on the copy paper by pressure transfer.

BACKGROUND OF THE INVENTION

This type of conventional image forming apparatus uses a photosensitive sheet of a strip shape coated with microcapsules containing leuco dye and light hardenable substance. After a latent image is formed on the photosensitive sheet through exposure, the photosensitive sheet and copy paper coated with developer, are superposed and pressed by pressure developing rollers. Consequently, the microcapsules of the parts on the photosensitive sheet the light did not irradiate which did not harden, burst and the desired image is formed on the copy paper by the leuco dye contained in the capsules.

The above-mentioned photosensitive sheet is wound on a core in a roll shape and made in the form of a photosensitive sheet cassette. The photosensitive sheet cassette is further stored in a carriage and may be installed and removed together with the carriage from the main body of the image forming apparatus.

When the photosensitive sheet cassette is replaced and loaded along with the carriage in the main body of the image forming apparatus, a leader sheet attached to the forefront of the photosensitive sheet, is wound through a loading mechanism on a winding shaft whereon the used photosensitive sheet will be wound. At this time, the above-mentioned leader sheet is sent into the transportation path of the photosensitive sheet by a transport roller, further passes the pressure developing rollers and a loading guide plate that guides the leader sheet, and reaches the winding shaft. After the leader sheet attained the winding shaft, the winding shaft keeps rotating for a predetermined period, and the leader sheet is wound on the winding shaft meanwhile. After the elapse of the predetermined period mentioned above, it is determined that the winding operation of the leader sheet is complete. In this state, the image forming operation may be performed.

On the other hand, during the image forming operation, the latent image formed through an exposure operation on the photosensitive sheet, is transferred on the copy paper by the pressure developing rollers. The copy paper is then guided in a prescribed transportation direction by a copy paper guide plate, mounted below the loading guide plate.

However, in the conventional structure described above, the loading guide plate mounted on the paper ejection side of the pressure developing rollers, is fixed. Thus, while the loading guide plate is located at a position where it is able to guide appropriately the leader sheet toward the winding shaft during the loading operation where the photosensitive sheet is wound around the winding shaft, there is a possibility that during the image forming operation after the loading operation is completed, it also sends the copy paper ejected from the pressure developing rollers, in the winding shaft direction.

Meanwhile, the conventional structure described above presents the inconvenience that making the interval between the loading guide plate and the copy paper guide plate a little wide in order to insure the transportation path of the copy paper, hinders the loading operation of the leader sheet.

Moreover, in the conventional structure mentioned above, after the leader sheet reached the winding shaft, the completion of the winding operation is determined in correspondence with the elapse of the predetermined rotation period of the winding shaft, and whether winding operation really ended is not sensed. Accordingly, the conventional structure presents the disadvantage that the winding of the leader sheet is considered to be completed even when it is not and thus that the reliability of the apparatus is insufficient in this matter.

Furthermore, the conventional structure presents also the inconvenience that the copy paper gets jammed easily and that the presence of the loading guide plate on the paper ejection side of the pressure developing rollers, is a hindrance when the jam processing operation is performed, that is when the operator inserts his or her hand in the section involved and removes the jammed copy paper.

SUMMARY OF THE INVENTION

An object of the present invention is to provide an image forming apparatus wherein, a photosensitive sheet is guided by a loading guide plate toward a winding shaft during the loading operation, and copy paper is guided accurately by a copy paper guide plate in a prescribed transportation direction without being guided by the loading guide plate in the winding shaft direction, during the image forming operation.

Another object of the present invention is to provide an image forming apparatus wherein the copy paper is guided accurately by the copy paper guide plate in the prescribed transportation direction during the image forming operation, by moving the loading guide plate to a retreat position simultaneously with the completion of the loading operation.

Still another object of the present invention is to provide an image forming apparatus capable of effectuating the loading operation, where the photosensitive sheet is wound on the winding shaft, by moving the loading guide plate to a loading position simultaneously with the replacement of the photosensitive sheet.

Yet another object of the present invention is to provide an image forming apparatus capable of sensing accurately the state of the photosensitive sheet wound by the winding shaft.

Further another object of the present invention is to provide an image forming apparatus wherein the photosensitive sheet is guided toward the winding shaft without obstruction and the operator is able to remove easily the copy paper jammed in the paper ejection section of pressure developing rollers without being hindered by the loading guide plate when processing a jam.

In order to achieve the objects mentioned above, the image forming apparatus in accordance with the present invention is characterized in being installed with:

a loading guide plate, capable of pivoting freely and incorporated in a carriage, installed in a section opposite to the section where the jam processing operation is carried out, on the transportation path of the photosensitive sheet, loading guide plate maintaining means mounted on the loading guide plate, for maintaining the loading guide plate in a loading position guiding the photosensitive sheet toward a winding shaft, and in a retreat position creating a transportation path for the copy paper between the loading guide plate and a copy paper guide plate, a horizontal shaft expanding over the loading guide plate surface in the cross direction of the loading guide plate, parallel to and connected with the loading guide plate, a loading guide plate driving member mounted on a member of the main body of the apparatus, that drives the loading guide plate to the loading position when the loading guide plate is drawn out together with the carriage, guide plate driving means for driving the loading guide plate to the loading position during the loading operation and to the retreat position during the image forming operation, and winding sensing means that functions in accordance with the stretching action of the photosensitive sheet when the forefront portion of the photosensitive sheet is wound on the winding shaft.

According to the arrangement mentioned above, when the photosensitive sheet is loaded in the main body of the apparatus, the forefront portion of the photosensitive sheet is guided to the winding shaft through pressure developing rollers and the loading guide plate, and is wound by the winding shaft through a loading mechanism. On the other hand, when the image forming operation is effectuated, a latent image formed on the photosensitive sheet through an exposure operation is transferred by the pressure developing rollers on the copy paper, and the copy paper is guided by the copy paper guide plate in a prescribed transportation direction.

The above-mentioned loading guide plate is capable of pivoting freely, is driven by the guide plate driving means, and is maintained in the loading position guiding the photosensitive sheet toward the winding shaft during the loading operation by the loading guide plate maintaining means. Thereby, during the loading operation, the photosensitive sheet is guided toward the winding shaft by the loading guide plate. As the photosensitive sheet passes between the loading guide plate and the horizontal shaft, when it is wound on the winding shaft and is in a stretched state, the photosensitive sheet pushes the horizontal shaft upwards. Consequently, the loading guide plate, which is connected to the horizontal shaft, is moved from the loading position to the retreat position, creating a transportation path for the copy paper between the copy paper guide plate and the loading guide plate, and is maintained in the retreat position by the loading guide plate maintaining means. Furthermore, the winding sensing means operates in response to the stretching action of the photosensitive sheet and senses accurately that the loading operation is completed. Therefore, in the present apparatus, the loading guide plate may be moved to the retreat position simultaneously with the completion of the loading operation. Thus, during the image forming operation, the copy paper may guided accurately by the copy paper guide plate in the prescribed transportation direction, without being guided by the loading guide plate toward the winding shaft.

Meanwhile, when the carriage is pulled out in order to replace the used photosensitive sheet by a new one, the loading guide plate, which is formed integrally with the carriage, is also taken out at the same time, and the loading guide plate is moved to the loading position by the loading guide plate driving member mounted on a member of the main body of the apparatus. Accordingly, in the present apparatus, as the loading guide plate may be moved to the loading position when the photosensitive sheet is replaced, the loading operation may be executed accurately simultaneously with the replacement.

Moreover, the above-mentioned loading guide plate is installed on a portion of the transportation path of the photosensitive sheet on the opposite side of the section where the processing of jams is carried out. Thus, when a jam is being processed, the operator may insert his or her hand in the jam processing operation section and remove easily the copy paper that jammed, without being hindered by the loading guide plate.

For a fuller understanding of the nature and advantages of the invention, reference should be made to the ensuing detailed description taken in conjunction with the accompanying drawings.

BRIEF DESCRIPTION OF THE DRAWINGS

FIG. 1 to FIG. 7 show an embodiment of the present invention.

DETAILED DESCRIPTION OF THE EMBODIMENTS

The following will describe an embodiment of the present invention with reference to FIG. 1 to FIG. 7.

Figure 2:
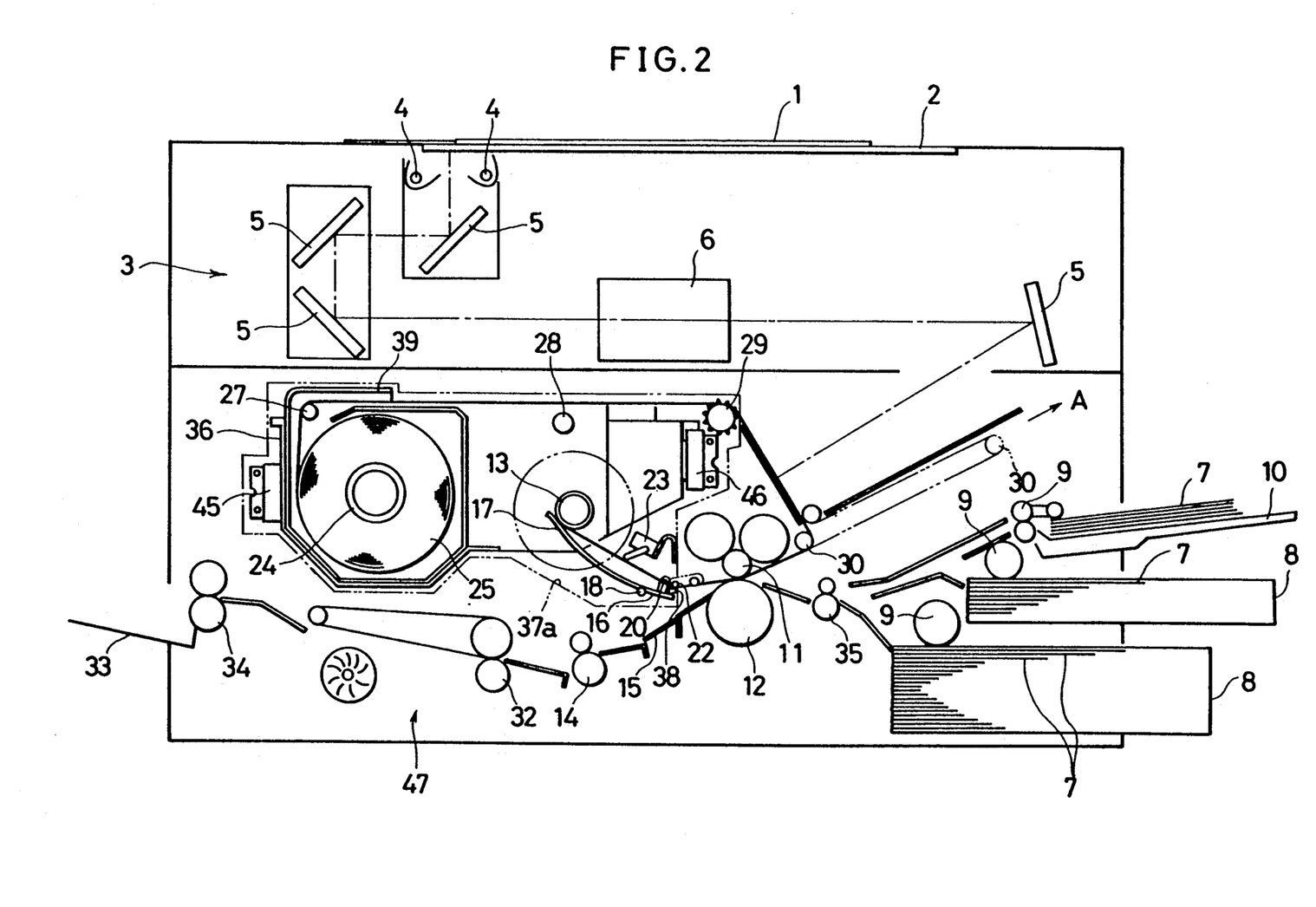
FIG. 2 is a schematic front view illustrating the entire configuration of the image forming apparatus.

The image forming apparatus in accordance with the present invention, as shown in FIG. 2, is provided in its upper part with an original document platen 2 whereon an original document to be copied is placed. Below the original document platen 2, there is installed an optical system 3 composed of two light source lamps 4, plural reflection mirrors 5 and a lens 6. The optical system 3 scans the original document 1 positioned on the original document platen 2 and irradiates the reflected light thereof on a photosensitive sheet 25 that will be described later.

Two paper feeding cassettes 8, containing cut sheet shaped copy paper sheets 7 of different sizes, are installed on one side of the image forming apparatus. On the paper ejection side of each paper feeding cassette 8, there is installed a paper feeding roller 9 that feeds the copy paper sheets 7 one by one. A manual paper feeding tray 10 is mounted on the top of the paper feeding cassettes 8. The above-mentioned copy paper 7 is coated with a developer that colors in reaction with the leuco dye of the photosensitive sheet 25, and thermoplastic resin is applied over the developer.

Figure 3:
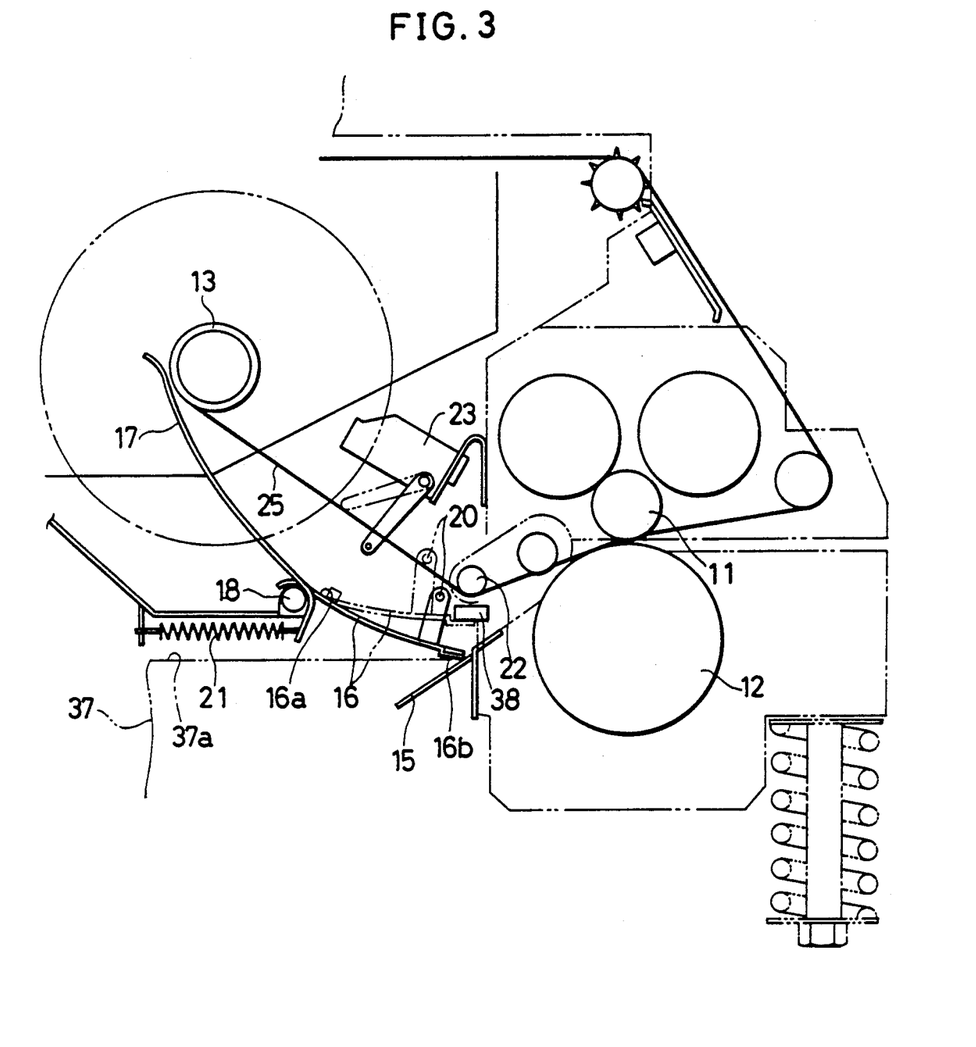
FIG. 3 is an enlarged view of the neighborhood of the loading guide plate of the image forming apparatus illustrated in FIG. 2.

A synchronous roller 35 is mounted in the paper ejection direction of the above-mentioned paper feeding cassettes 8. Further, in the paper ejection direction of the synchronous roller 35 are installed an upper pressure roller 11 and a lower pressure roller 12, touching and pressing each other, as shown in FIG. 3. The synchronous roller 35 feeds the above-mentioned copy paper 7 between the upper pressure roller 11 and the lower pressure roller 12 at a predetermined timing. Upwards in the paper ejection direction from the upper and lower rollers 11 and 12, there is mounted a winding roller 13, as a winding shaft winding the photosensitive sheet 25 that was used. The winding roller 13 is installed in a cassette case 39 of a photosensitive sheet cassette 26 that will be outlined later.

In the paper ejection direction of the lower pressure roller 12, there is installed a copy paper guide plate 15, that guides the copy paper 7 to a transport roller 14, and a leader sheet 31 to be described later to a loading guide plate 16. Between the copy paper guide plate 15 and the winding roller 13, are installed the loading guide plate 16 and a transport guide plate 17, each curved in an arcuate shape. Both guide plates 16 and 17 mentioned above, are formed integrally with a carriage 36 to be described later, and are capable of pivoting around a supporting shaft 18, as illustrated in FIG. 1 and FIG. 3.

Figure 1:
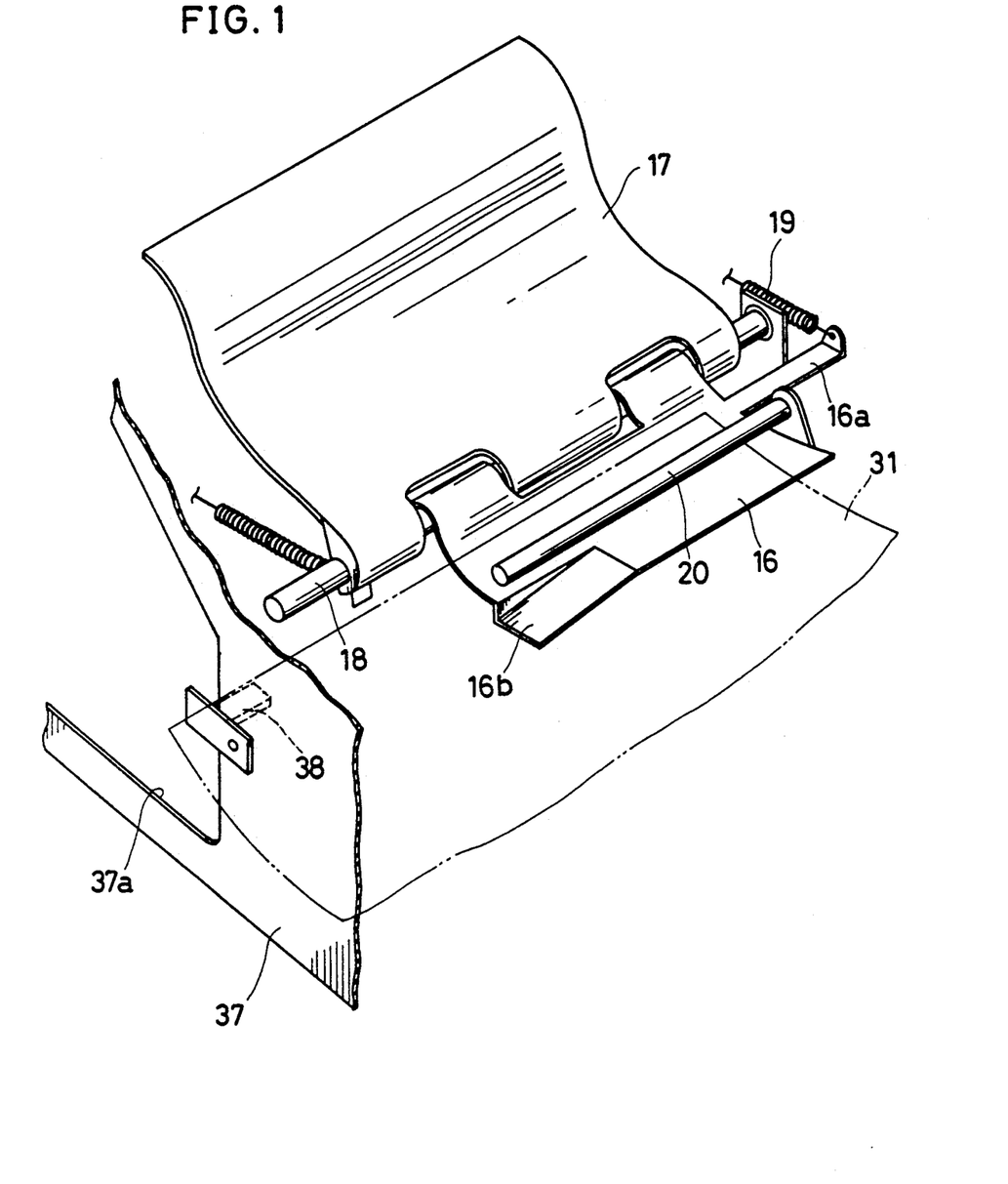
FIG. 1 is a perspective view illustrating the configuration in the neighborhood of the loading guide plate.

The loading guide plate 16, as shown in FIG. 1, is formed such as to be narrower than the width of the leader sheet 31, and is installed, as shown in FIG. 2, on the opposite side of the section where the processing of jams is carried out on the front of the image forming apparatus, namely in the back section of the image forming apparatus. The width of the loading guide plate 16 is set between $\frac{1}{4}$ and $\frac{3}{4}$ of the width of the leader sheet 31, in order to create a space for processing jams easily. With a width of this range, the transport of the leader sheet 31 may be carried out without difficulty.

Figure 4:
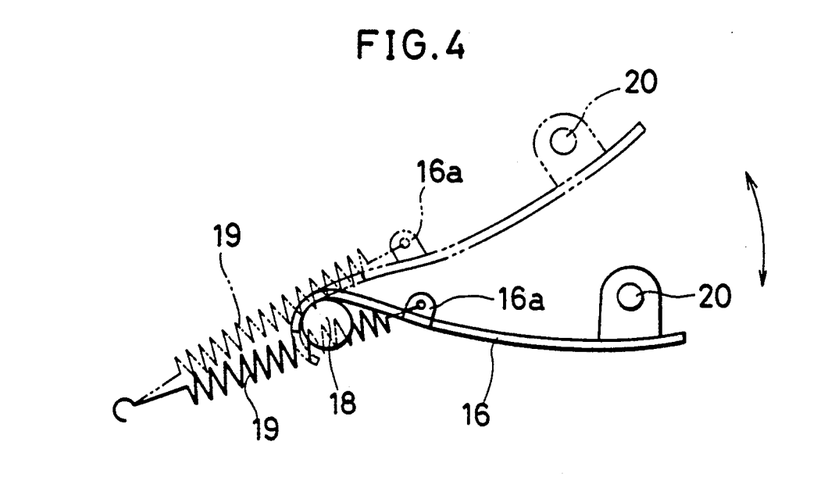
FIG. 4 is a view illustrating the operation of the loading guide plate.

A spring junction part 16a is formed at the edge of the back section of the loading guide plate 16. The loading guide plate 16 is pulled toward the supporting shaft 18 by a tension spring 19 as loading guide plate maintaining means connected to the spring junction part 16a. Accordingly, the loading guide plate 16, as illustrated in FIG. 4, can be positioned and maintained in either loading position, when it pivoted downward, and retreat position, when it pivoted upward. Further, a contact section 16b downward-inclined toward the front of the apparatus, is formed at the edge of the front side lower end of the loading guide plate 16, as shown in FIG. 1. When the loading guide plate 16 is pulled together with a carriage 36, to be described later, out of the main body of the image forming apparatus, the contact section 16b hits and enters in contact with a contact member 38 mounted on an aperture section 37a of a side panel 37 that is located in the front direction of the loading guide plate 16. The contact section 16b is then pushed downwards by the contact member 38 and the loading guide plate 16 pivots downwards to the loading position. On the surface of the loading guide plate 16 there is installed a cantilever shaft 20, as a horizontal shaft parallel to the loading guide plate 16 and expanding in the cross direction of the loading guide plate 16 from the back edge thereof. Provision is made such that the leader sheet 31 and the photosensitive sheet 25 pass between the loading guide plate 16 and the cantilever shaft 20.

Meanwhile, the lower edge of a transport guide plate 17 is pulled by a tension spring 21, as illustrated in FIG. 3, and thus the leading edge is pressed to the leader sheet 31 or the photosensitive sheet 25 wound on the winding roller 13.

A separation guide shaft 22 is installed upward from the copy paper guide plate 15, and a winding sensing switch 23, as winding sensing means, is mounted between the separation guide shaft 22 and the winding roller 13. When the leading edge of the photosensitive sheet 25, that is the leader sheet 31, is wound on the winding roller 13 through a loading mechanism and when tension arises in the photosensitive sheet 25 between the roller 13 and the separation guide shaft 22, the winding sensing switch 23 is pushed by the photosensitive sheet 25 and switched ON. The winding sensing switch 23 is connected to control means, not shown, that controls the loading mechanism. When the winding sensing switch 23 is switched ON, the control means stops the loading mechanism and moves on to the image forming process.

On the other hand, after the leader sheet 31 reached the winding roller 13, when the winding roller 13 rotates for a predetermined time but the winding sensing switch 23 is not switched ON, the above-mentioned control means determines that the winding of the leader sheet 31 is not completed. The control means then stops the loading mechanism, rotates a feed roller 24 and rewinds the leader sheet 31 and the photosensitive sheet 25. The rewinding operation is stopped before the leading edge of the leader sheet 31 enters into the photosensitive sheet cassette 26 outlined earlier, and there is displayed that the winding of the leader sheet 31 on the winding roller 13 is not completed. The loading operation starts again after the cause of the malfunction is eliminated by the operator.

Figure 5:
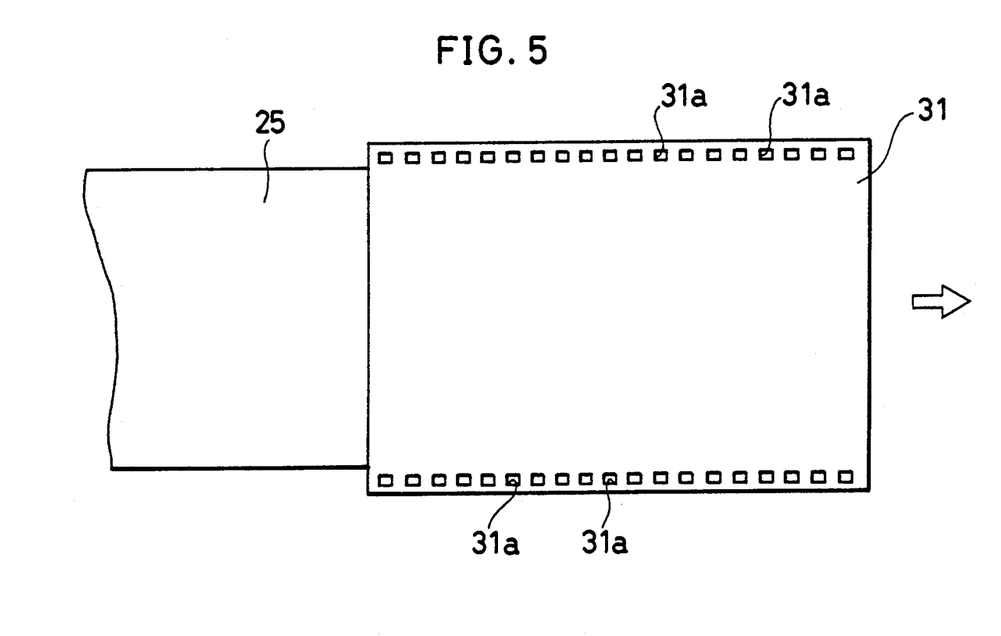
FIG. 5 is a plan view illustrating the leader sheet attached to the forefront of the photosensitive sheet.

As illustrated in FIG. 2, the photosensitive sheet 25 supported by the feed shaft 24 is installed beside the winding roller 13. The photosensitive sheet 25 is made of a photosensitive and pressure sensitive material, and a plurality of microcapsules having a diameter of about 10 to 20 $\mu$m containing leuco dye and light hardenable substance, are coated on a light reflective metallic sheet of aluminum or other metal. The photosensitive sheet 25 is wound in a roll shape, and a leader sheet 31, for leading the photosensitive sheet 25 to the winding roller 13, is welded by heat at its forefront, as shown in FIG. 5. A plurality of perforations 31a are formed along the edges of both sides of the leader sheet 31.

Figure 6:
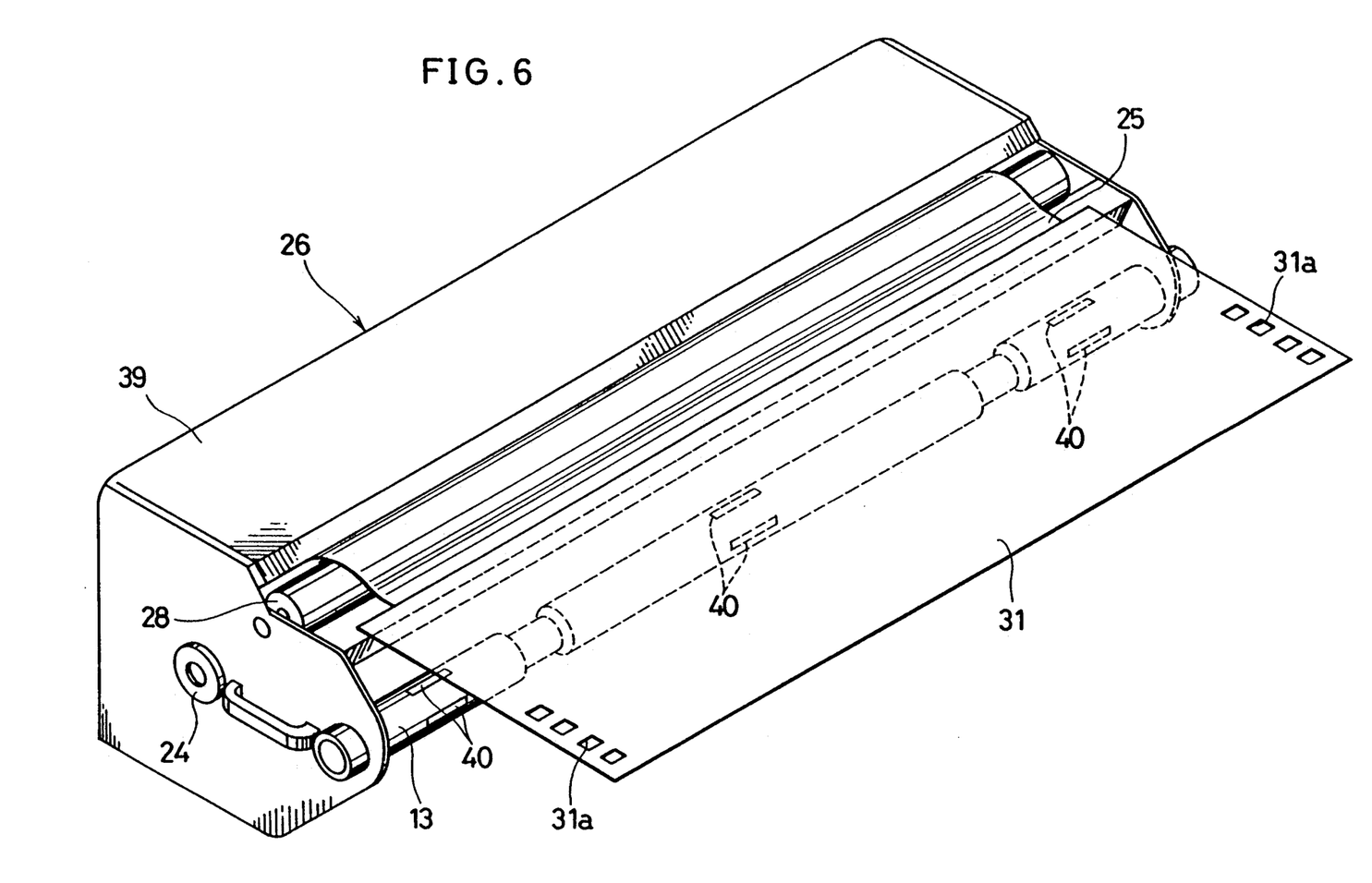
FIG. 6 is a perspective view illustrating the photosensitive sheet cassette.

The above-mentioned photosensitive sheet 25, as illustrated in FIG. 6, is stored inside a light proof cassette case 39, and is formed as the photosensitive sheet cassette 26. In the upper part inside the cassette case 39, a transport roller 28 and a guide roller 27, shown in FIG. 2, are installed. The feed shaft 24 whereon the photosensitive sheet 25 is wound, and the winding roller 13 described earlier, are mounted below the two rollers 27 and 28. Pieces of pressure sensitive adhesive double coated tape 40 are stuck at a plurality of locations on the surface of the winding roller 13. When the loading operation is performed, the winding of the leader sheet 31 may be achieved by fixing the leader sheet 31 on the pieces of pressure sensitive adhesive double coated tape 40.

Figure 7:
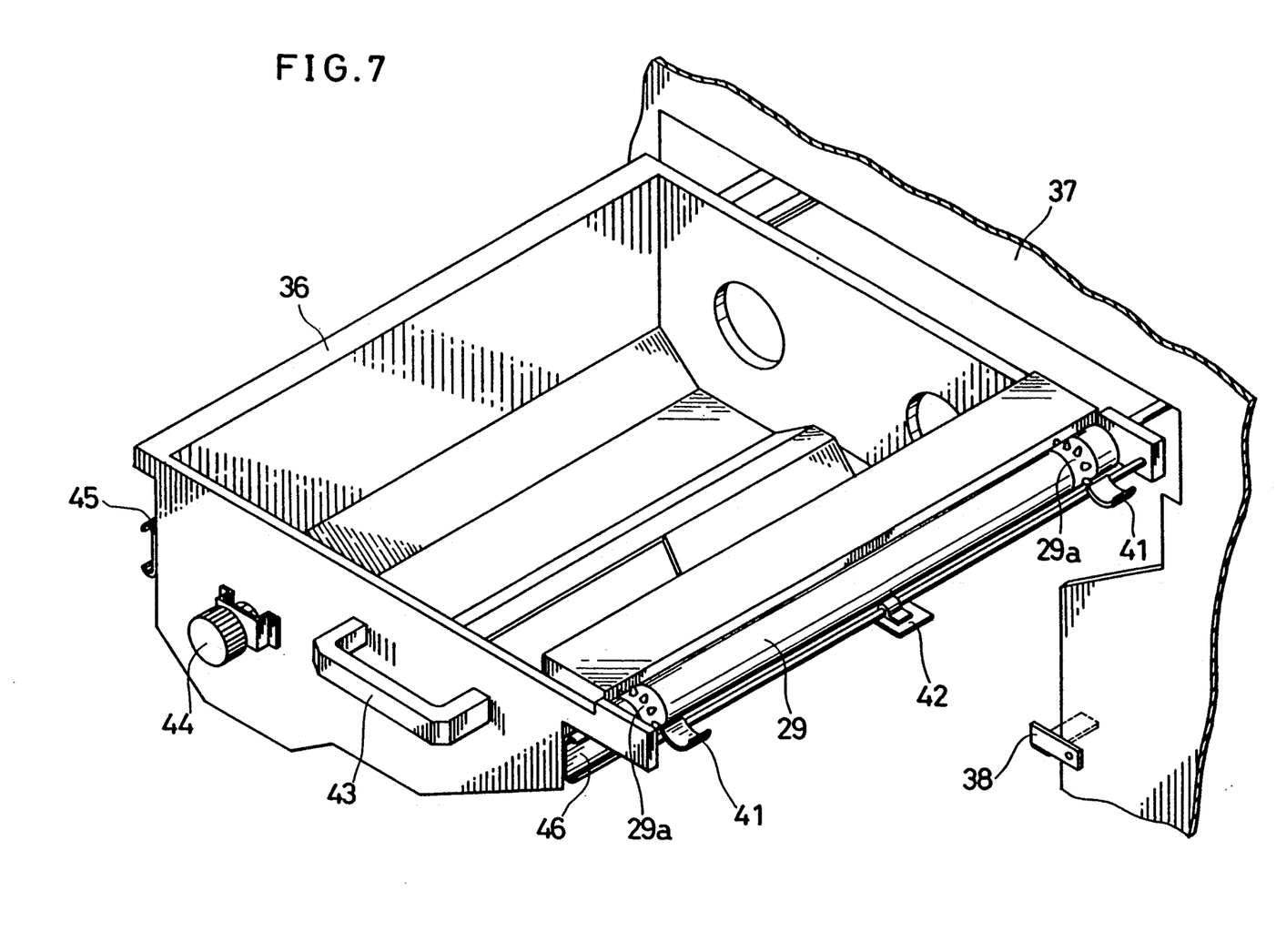
FIG. 7 a perspective view illustrating a situation where the carriage in which the photosensitive sheet cassette is not set, is pulled from the front out of the main body of the apparatus.

The above-mentioned cassette 39 is installed in the carriage 36, illustrated in FIG. 7, and may be installed and removed freely. In the carriage 36 there are mounted a tractor roller 29 provided with sprockets 29a at both edges, guide members 41 for holding down the photosensitive sheet 25, a manipulation plate 42 for adjusting the positions of the guide members 41, a handle 43 for pulling out the carriage 36, a manipulation section 44 for rotating the feed shaft 24 shown in FIG. 6 according to the operator's will, and other parts. Also, the carriage 36 may be drawn out in the front direction with respect to the main body of the image forming apparatus, by means of sliders 45 and 46 mounted on both sides of the carriage 36. Furthermore, the aforementioned loading guide plate 16, transport guide plate 17 and supporting shaft 18, as shown in FIG. 1, are formed integrally with the carriage 36. Both guide plates 16 and 17 as well as the supporting shaft 18 are pulled out, following the drawing operation of the carriage 36.

The photosensitive sheet 25 inside the photosensitive sheet cassette 26 is arranged so as to be wound on the winding roller 13 through the guide roller 27, the transport roller 28, the tractor roller 29, a buffer roller 30, the upper and lower pressure developing rollers 11 and 12, the separation guide shaft 22 and the cantilever shaft 20, as shown in FIG. 2. The above-mentioned buffer roller 30 is arranged so as to move at a prescribed speed in the direction of the arrow A during the exposure operation of the present apparatus. This prescribed speed is determined according to the copy magnification, and the original document scanning speed, that is the travel speed of the light source lamps 4. The loading mechanism is constituted by the above-mentioned tractor roller 29, buffer roller 30, upper and lower pressure developing rollers and 12, separation guide shaft 22, copy paper guide plate 15, loading guide plate 16, transport guide plate 17, rollers driving device, not shown, control means, winding sensing switch 23 and other parts.

Moreover, in the front direction of the above-mentioned carriage 36, as illustrated in FIG. 1, the side panel 37, as a member of the apparatus main body is mounted vertically. The aperture section 37a, for drawing the carriage 36 in the front direction and for processing jams, is formed at a position fitting the carriage 36. The contact member 38, as the loading guide plate driving member, is installed at the aperture section 37a, as outlined earlier. And guide plate driving means is composed of the above-mentioned tension spring 19, cantilever 20 and contact member 38.

Meanwhile, as illustrated in FIG. 2, the transport roller 14 that conveys the copy paper 7 ejected from the upper and lower pressure developing rollers 11 and 12, is installed downstream in the diagonal direction from the copy paper guide plate 15. A glossing device 47 provided with a heat roller 32, is installed on the paper ejection side of the transport roller 14. Furthermore in the paper ejection direction of the glossing device 47 is mounted a paper discharge roller 34 that discharges the copy paper 7 in a paper discharge tray 33. The above-mentioned glossing device 47 is arranged so as to boost the coloring of the color image formed on the copy paper 7, to melt the thermoplastic resin covering the developer of the copy paper 7 with the heat roller 32 and make it even, thereby imparting gloss to the surface of the color image.

In the structure described above, the original document 1 placed on the original document platen 2, is scanned by the light source lamps 4 of the optical system 3, and the reflected light from the original document 1 is irradiated on the photosensitive sheet 25 through the reflection mirrors 5 and the lens 6. In response to the exposure operation, the photosensitive sheet 25 is sent forward by the guide roller 27, transport roller 28, tractor roller 29, buffer roller 30 and other parts, and a latent image corresponding to the image of the original document 1 is formed on the photosensitive sheet 25. The copy paper 7 sent out from one of the paper feeding cassettes 8 or the manual paper feeding tray 10 by the paper feeding roller 9, is fed by the synchronous roller 35 between the upper and lower pressure developing rollers 11 and 12 in synchronization with the latent image of the photosensitive sheet 25. The photosensitive sheet 25 and the copy paper 7 are then superposed and compressed by the upper and lower pressure developing rollers 11 and 12. The microcapsules of the photosensitive sheet 25 which are not hardened, burst, the leuco dye contained in the microcapsules flows out, the developer on the copy paper 7 reacts causing a color image to be formed on the copy paper 7.

The photosensitive sheet 25 that passed through the pressure developing operation, is wound by the winding roller 13 through the separation guide shaft 22. As to the copy paper 7, it passes on the copy paper guide plate 15, reaches the transport roller 14 and is conveyed to the glossing device 47. After the copy paper 7 reached the glossing device 47, it is glossed by heat and pressure, and then discharged on the paper discharge tray 33 by the paper discharge roller 34.

When the copy paper 7 happened to jam in the paper ejection section of the upper and lower pressure developing rollers 11 and 12 during the image forming operation, the operator inserts his or her hand into the jam processing operation section, namely the aperture section 37a of the side panel 37, and removes the jammed copy paper 7. As the loading guide plate 16 is installed on the opposite side of the jam processing operation section, it does not impede the jam processing operation which may be therefore carried out easily. Further, since the loading guide plate 16 is formed so that its width represents ¼ to ¾ of the width of the leader sheet 31, a large space is created in the jam processing operation section. Thus the jam processing operation may be performed still more easily. Also, with a size of the aforementioned range, the transport of the leader sheet 31 may be carried out without difficulty.

On the other hand, when replacing the used photosensitive sheet 25 by a new one, the operator draws the carriage 36 in the front direction of the main body of the apparatus by pulling the handle 43 of the carriage 36. At this time, the used photosensitive sheet 25 is wound on the winding roller 13. When the carriage 36 is drawn, and the loading guide plate 16 and transport guide plate 17 are drawn simultaneously, the contact section 16b of the loading guide plate 16 hits the contact member 38 mounted on the side panel 37, the loading guide plate 16 pivots downwards and is maintained in the loading position by the tension spring 19.

Then, the used photosensitive sheet cassette 26 is taken out from the carriage 36, and a new photosensitive sheet cassette 26 is set. The carriage 36 is then pushed backward in the main body of the apparatus and placed in the prescribed position.

Subsequently, the leader sheet 31 is sent forward in the transportation path of the photosensitive sheet 25 by the loading mechanism, and is wound by the winding roller 13. First, the operator rotates manually the manipulation section 44 of the carriage 36 in order to send the photosensitive sheet 25 out, further fits the perforations 31a of the leader sheet 31 on the sprockets 29a of the tractor roller 29 and holds down the leader sheet 31 with the guide members 41. When the leader sheet 31 is in this state and the loading mechanism is operated, the leader sheet 31 passes on the buffer roller 30 and between the upper and lower pressure developing rollers 11 and 12, is guided by the copy paper guide plate 15 and the loading guide plate 16 and passes between the loading guide plate 16 and the cantilever shaft 20, is further guided by the transport guide plate 17 and reaches the winding roller 13. The leader sheet 31 then adheres to the pieces of pressure sensitive double coated adhesive tape 40 of the winding roller 13, and is wound by the winding roller 13.

When the leader sheet 31 is wound on the winding roller 13 through the loading operation in the manner described above, the leader sheet 31 as well as the photosensitive sheet 25 attached thereto are stretched in the portion between the winding roller 13 and the separation guide shaft 22. Because of this tension, the cantilever shaft 20 is pushed upwards and the loading guide plate 16 which is connected to the cantilever plate 20, pivots upwards to the retreat position and is maintained in this position by the tension spring 19. The transportation path of the copy paper 7 on the copy paper guide plate 15 is thus created, and the copy paper 7 that was ejected by the upper and lower pressure developing rollers 11 and 12, is sent accurately to the glossing device 47, without being guided upwards by the loading guide plate 16.

Also, because the photosensitive sheet 25 stretches as mentioned above, it presses the winding sensing switch 23 which turns ON. The control means senses that the winding sensing switch 23 turned ON and suspends the loading mechanism. The apparatus then moves on to the image forming process. Accordingly, in the present apparatus, the completion of the loading operation may be sensed accurately.

Moreover, the guide plate driving means does not need to be restricted to the configuration illustrated in the present embodiment but may be composed for example of a solenoid for driving the loading guide plate 16, the above-mentioned winding sensing switch 23 for sensing the completion of the loading operation, and control means that control the operation of the solenoid in accordance with the ON/OFF operation of the winding sensing switch 23.

An image forming apparatus in accordance with the present invention is characterized as described above, in being mounted with:

a loading guide plate capable of pivoting freely, incorporated in a carriage, and installed on a section of the photosensitive sheet transportation path on the opposite side of a jam processing operation section, loading guide plate maintaining means mounted on the aforementioned loading guide plate, maintaining the loading guide plate in a loading position guiding the photosensitive sheet toward a winding shaft, and in a retreat position creating a transportation path for copy paper between the loading guide plate and a copy paper guide plate, a horizontal shaft expanding in the cross direction over the surface of the loading guide plate, connected to and parallel to the loading guide plate, a loading guide plate driving member installed on a member of the main body of the apparatus, that drives the loading guide plate to the loading position when the loading guide plate is drawn out together with the carriage, and winding sensing means that functions in accordance with the stretching action between the winding shaft and pressure developing rollers, of the photosensitive sheet when the forefront portion of the photosensitive sheet is wound on the winding shaft.

Consequently, the photosensitive sheet may be guided by the loading guide plate toward the winding shaft during the loading operation, and the loading guide plate may be moved to the retreat position simultaneously with the completion of the loading operation. Accordingly, during the image forming operation, the transportation path of the copy paper is not obstructed by the loading guide plate and the copy paper may be guided accurately by the copy paper guide plate in the prescribed transport direction. Further, when replacing the photosensitive sheet, the loading guide plate may be moved to the loading position and as a result the loading operation may be performed accurately simultaneously with the replacement of the photosensitive sheet.

Also, the completion of the loading operation may be sensed accurately by the winding sensing means, and the reliability of the apparatus may be improved.

Furthermore, when processing a copy paper jam, the operator is able to remove easily the copy paper that jammed in the paper ejection section of the pressure developing rollers without being hindered by the aforementioned loading guide plate.

The invention being thus described, it may be obvious that the same may be varied in many ways. Such variations are not to be regarded as a departure from the scope of the invention.

There are described above novel features which the skilled man will appreciate give rise to advantages. These are each independent aspects of the invention to be covered by the present application, irrespective of whether or not they are included within the scope of the following claims.

What is claimed is:

1. An image forming apparatus comprising:
a photosensitive sheet wound in a roll;
a carriage that contains said photosensitive sheet and that is freely installed in and removed from the main body of said apparatus;
copy paper whereon a latent image that was formed on said photosensitive sheet through an exposure operation is transferred;
pressure developing rollers that superpose and press said photosensitive sheet and said copy paper;
winding shaft whereon said photosensitive sheet is wound after use;
loading guide plate that guides, together with said pressure developing rollers, the forefront portion of said photosensitive sheet toward said winding shaft through a loading mechanism, when said photosensitive sheet is loaded in the main body of said apparatus;
a horizontal shaft expanding in the cross direction of said loading guide plate and in parallel with the surface of said loading guide plate;
loading guide plate maintaining means that is connected to an edge section of said loading guide plate through a junction section;
a loading guide driving member mounted on a member of the main body of said apparatus, that drives said loading guide plate to a loading position when said loading guide plate is removed together with said carriage;
winding sensing means that functions in accordance with a stretching action of said photosensitive sheet when the forefront portion of said photosensitive sheet is wound on said winding shaft; and copy paper guide plate that guides said copy paper whereon a latent image was transferred during the image forming operation, in a prescribed transport direction, said loading guide plate being capable of pivoting freely, formed integrally with said carriage, and installed on the opposite side of a jam processing operation section located inside said apparatus.

2. The image forming apparatus as defined in claim 1, wherein pieces of pressure sensitive adhesive double coated tape are stuck on said winding shaft.

3. The image forming apparatus as defined in claim 1, wherein the width of said loading guide plate is fixed between ¼ and ¾ of the width of said photosensitive sheet.

4. The image forming apparatus as defined in claim 1, wherein said winding sensing means comprises a winding sensing switch installed between said winding shaft and said pressure developing rollers, that turns ON in accordance with the tension of said photosensitive sheet.

5. The image forming apparatus as defined in claim 4, further comprising a control device, and arranged so as to suspend the operation of said loading mechanism when said winding sensing switch turns ON.

6. An image forming apparatus comprising:

a photosensitive sheet wound in a roll;

copy paper whereon a latent image that was formed on said photosensitive sheet through an exposure operation is transferred;

a winding shaft whereon said photosensitive sheet that was used is wound;

a loading guide plate capable of pivoting freely that guides the forefront portion of said photosensitive sheet toward said winding shaft when said photosensitive sheet is loaded in the main body of said apparatus, and that is installed on the opposite side of a jam processing operation section located inside said apparatus; and guide plate driving means for driving said loading guide plate to a loading position guiding said photosensitive sheet toward said winding shaft during the loading operation, and for driving said loading guide plate to a retreat position creating a transportation path for said copy paper between a copy paper guide plate and said loading guide plate during an image forming operation.

7. The image forming apparatus as defined in claim 6, wherein said guide plate driving means comprises:

a tension spring connected to one edge of said loading guide plate through a junction section;

a cantilever shaft expanding in the cross direction of said loading guide plate and parallel to said loading guide plate; and a contact member formed on a member of the main body of said apparatus, that drives said loading guide plate in the loading position when said loading guide plate is removed from the main body of said apparatus.

8. The image forming apparatus as defined in claim 6, wherein said guide plate driving means is composed of:

a solenoid that drives said loading guide plate, a winding sensing switch that senses the completion of the loading operation, and control means that controls the operation of the solenoid in accordance with the ON/OFF operation of the winding sensing switch.

9. An image forming apparatus comprising:

a photosensitive sheet wound in a roll;

copy paper whereon a latent image that was formed on said photosensitive sheet through an exposure operation is transferred;

a winding shaft whereon said photosensitive sheet that was used is wound;

a loading guide plate capable of pivoting freely, that guides the forefront portion of said photosensitive sheet toward said winding shaft when said photosensitive sheet is loaded in the main body of said apparatus, and that is installed on the opposite side of a jam processing operation section located inside the main body of said apparatus;

loading guide plate maintaining means mounted on said loading guide plate, that maintains said loading guide plate in a loading position guiding said photosensitive sheet toward said winding shaft, and in a retreat position creating a transportation path for said copy paper between a copy paper guide plate and said loading guide plate; and a horizontal shaft expanding in the cross direction of said loading guide plate, connected to and parallel with said loading guide plate.

10. The image forming apparatus as defined in claim 9, wherein said loading guide plate maintaining means is composed of a tension spring.

11. An image forming apparatus comprising:

a photosensitive sheet wound in a roll;

a carriage detachable with respect to the main body of said apparatus and containing said photosensitive sheet;

copy paper whereon a latent image that was formed on said photosensitive sheet through an exposure operation is transferred;

a winding shaft whereon said photosensitive sheet that was used is wound;

a loading guide plate capable of pivoting freely, that guides the forefront portion of said photosensitive sheet toward said winding shaft when said photosensitive sheet is loaded in the main body of the said apparatus, and that is installed on the opposite side of a jam processing operation section located inside said apparatus;

loading guide plate maintaining means that maintains said loading guide plate in a loading position guiding said photosensitive sheet toward said winding shaft, and maintains said loading guide plate in a retreat position creating a transportation path for said copy paper between a copy paper guide plate and said loading guide plate; and a loading guide plate driving member that drives said loading guide plate to said loading position when said loading guide plate is removed together with said carriage.

12. The image forming apparatus as defined in claim 11, wherein said loading guide plate maintaining means comprises a tension spring.

13. The image forming apparatus as defined in claim 11, wherein said loading guide plate driving member comprises a contact member formed on a member of the main body of said apparatus.

14. A method for loading in an image forming apparatus comprising:

a step wherein a photosensitive sheet is sent manually and fixed on a prescribed position, a step wherein a loading mechanism operates and the forefront portion of said photosensitive sheet passes between upper and lower pressure developing rollers, a copy paper guide plate, a loading guide plate and a cantilever shaft, and a transport guide plate, and then reaches a winding shaft, a step wherein the forefront portion of said photosensitive sheet is wound on said winding shaft after adhering to said winding shaft, and whereby said photosensitive sheet stretches; and a step wherein said cantilever shaft is pressed upwards by said stretched photosensitive sheet, said loading guide plate connected with said cantilever shaft pivots upwards to a retreat position and is maintained in this position by loading guide plate maintaining means, winding sensing means senses that the loading operation is completed, and a control device suspends the loading mechanism.

* * * * *